United States Patent [19]
Zell

[11] Patent Number: 5,835,588
[45] Date of Patent: Nov. 10, 1998

[54] DIGITAL DICTATION SYSTEM WITH PROTECTION AGAINST UNAUTHORIZED LISTENING-IN

[75] Inventor: Horst Zell, Nürnberg, Germany

[73] Assignee: Grundig AG, Fuerth, Germany

[21] Appl. No.: 507,490

[22] PCT Filed: Dec. 23, 1994

[86] PCT No.: PCT/JP93/03663

§ 371 Date: Aug. 15, 1995

§ 102(e) Date: Aug. 15, 1995

[87] PCT Pub. No.: WO94/19886

PCT Pub. Date: Sep. 1, 1994

[30] Foreign Application Priority Data

Feb. 26, 1993 [DE] Germany ............ 43 05 960.0

[51] Int. Cl.[6] .................. H04L 9/00; G11B 15/04; G11B 19/04; H04M 1/64
[52] U.S. Cl. .................. 380/4; 360/60; 379/67
[58] Field of Search .............. 380/3, 4; 379/67–89, 379/143, 144; 360/60; 367/198

[56] References Cited

U.S. PATENT DOCUMENTS 4,562,489 12/1985 Gaskell et al. .............. 360/39
5,023,741 6/1991 Conti et al. ................ 360/132
5,136,648 8/1992 Olson et al. ................ 380/4
5,282,247 1/1994 McLean et al. .............. 380/4
5,469,557 11/1995 Salt et al. .................. 380/4

FOREIGN PATENT DOCUMENTS 3811378 10/1988 Germany.
4139197 6/1992 Germany.
4228692 1/1993 Germany.
8810352 U 1/1998 Germany.

OTHER PUBLICATIONS

S. Inoue, OEP Feb. 1989, "Sanyo Looks Toward Digital Voice Recording", p. 40.

Primary Examiner—Stephen C. Buczinski
Attorney, Agent, or Firm—Paul J. Vincent

[57] ABSTRACT

In the present state of the art, digital dictation machines with interchangeable semiconductor stores in the form of chip cards are known. The present invention describes a dictation system consisting of a mobile and stationary dictation machines in which the unauthorized listening-into dictated items is prevented by a code lock. The special nature of the coding of the machine and the code exchange between the chip card and the dictation machine is disclosed in particular. The code for a given machine configuration is established from a central reproduction station.

4 Claims, 1 Drawing Sheet

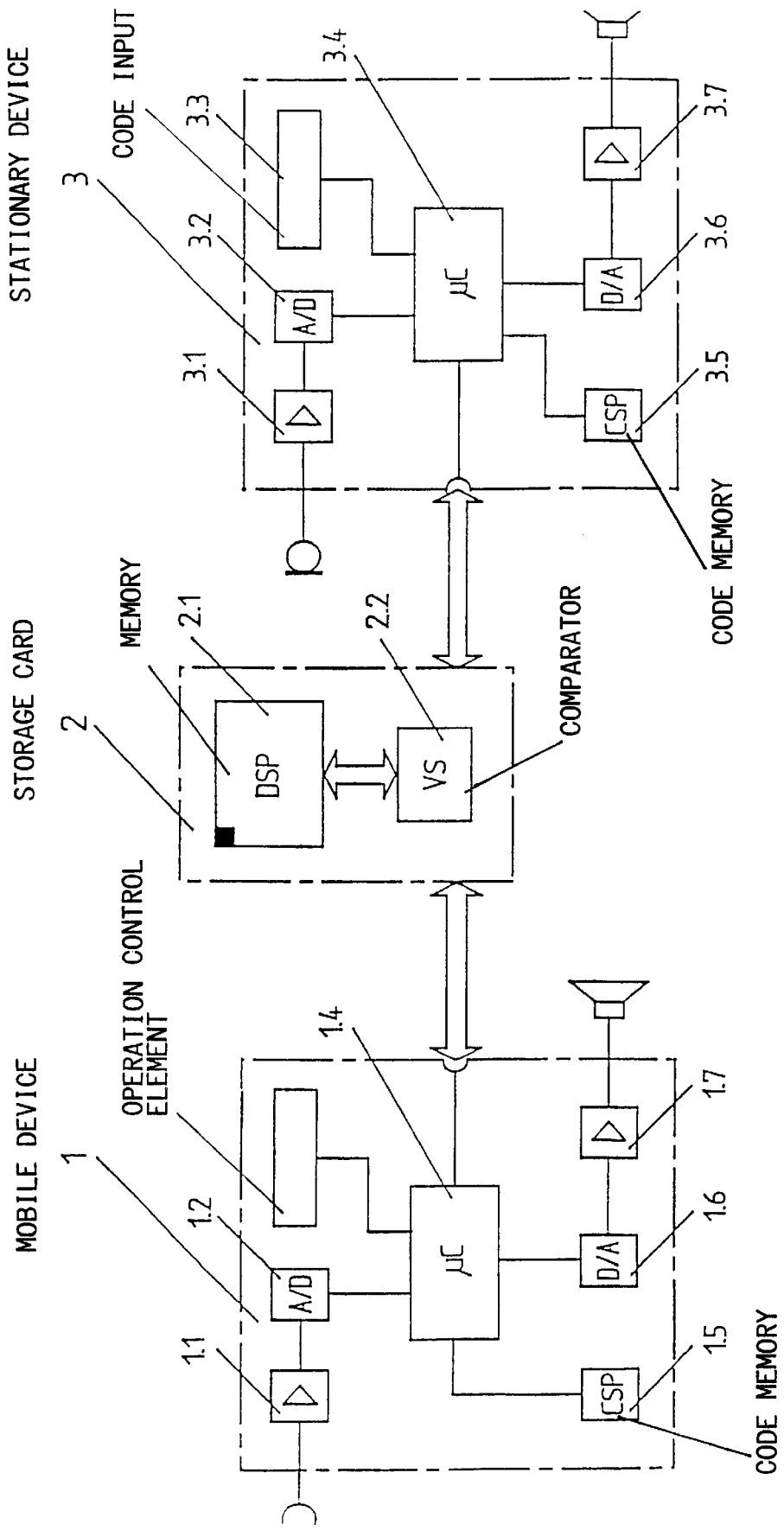

DIGITAL DICTATION SYSTEM WITH PROTECTION AGAINST UNAUTHORIZED LISTENING-IN

BACKGROUND OF THE INVENTION

The invention concerns a digital dictation system with protection against unauthorized listening-in consisting essentially of mobile and/or stationary dictating devices as recording and/or playback devices with the devices for the conversion of analog speech signals and digital data and vice versa and with data storage media in the form of exchangeable storage cards with digital semi-conductor memory.

A chip card, is known in the art from DE 42 28 692 A1 which contains a semi-conductor memory for the storage of digital audio or video signals. In a device for the utilization of this chip card, the analog audio or video signal from the signal source is initially digitized and then introduced into a compression module in order to obtain as long a recording time as possible for a given storage capacity. The publication also refers to a security logic which is realized with the assistance of a processor integrated on the chip card. The publication, however, gives no indication in which manner the information stored on the chip card is secured and through which means an access to the contents of the memory through exchange of the chip card between different recording and playback devices is prevented or rendered possible.

DE 88 10 352 U1 discloses a stationary and mobile dictation device with a statically operated sound recording medium in the form of a chip card, whereby the digital sound recording medium is transferred between a stationary operated playback device and a mobile-operated hand recording/playback device. The publication does not, however, suggest protection of the stored information against unauthorized listening-in.

DE 41 39 197 A1 describes a semi-conductor memory unit for use in connection with a data processing device with which the access to stored data is first enabled when an externally introduced address signal agrees with a security code produced within the memory unit. The publication, however, does not suggest protection against unauthorized listening-in of dictations within a digital dictation system comprising mobile and stationary dictation devices. Furthermore, the mentioned publication does not disclose any possibility for individually encoding semi-conductor memory units so that their association with particular data processing devices or device use groups can be arbitrarily varied.

In the journal "OEP" (Office Equipment & Products) February 1989, page 40, a reference to a digital hand dictating device of the company Sanyo having model designation ICM-1 is given. An IC-card with a static RAM is utilized as a storage medium. There is, however, no indication of listening-in protection for the stored dictation in this publication.

The utilization of an IC-card as a storage building block in an information recording system is known in the art from DE 38 11 378 A1. The IC-card contains a microprocessor, a semi-conductor memory, and a magnetic or optical bulk memory. The access to the bulk memory is secured by address information which is deposited in the semi-conductor memory and can only be read out via the microprocessor. Only with the assistance of this address information is it possible to recall data stored at various storage locations in the bulk memory in the proper sequence. In addition, in order to allow the stored data to only be accessed by particular device users or to be read out only with particular terminals, the semi-conductor memory additionally contains appropriate identification information which is, when recalling data, initially compared to corresponding identification codes which are to be input.

Regardless of the fact that, for the actual storage of data, a magnetic or optical bulk memory is necessary, the described information recording system has the disadvantage of requiring particular security steps from the device user when writing or reading data, which renders operation of the device more difficult. In addition, since the bulk memory is accessible from the outer side of the IC-card, a decoding of the stored data using external means cannot be prevented.

The object of the present invention is therefore concerned with the purpose of, in a digital dictation system comprising mobile and stationary dictation devices, protecting the stored contents of the chip card storage medium against unauthorized reading-out while nevertheless allowing for playback of the stored information on the particular playback devices designated therefor without thereby demanding particular decoding measures on the part of device users in each case. In addition, a reading-out of information secured in the data memory via a previously utilized code by means of a subsequent decoding of the chip card is to be prevented. Likewise an external sampling of a security code from the storage medium of a chip card for purposes of manipulated decoding of a playback device should be impossible.

SUMMARY OF THE INVENTION

This purpose is achieved with a digital dictation system wherein each individual storage card is configured in such a fashion that the memory content of the data memory on the storage card is protected against unauthorized read-out by means of a freely selectable code which is to be written in a partial region of the data memory;

a read-out stoppage of dictation deposited in the data memory which is effected via comparator circuit on the storage card is first freed when the code communicated to the storage card from the playback device agrees with the code deposited on the storage card;

the code deposited on the storage card can only be sampled by the comparator circuit with an external read-out of the code via contacting of the storage card not being possible; and the safety code deposited on the storage card can then only be replaced with a new code when the entire memory content of the data memory is first erased. Advantageous embodiments of the invention are disclosed in the dependent claims.

The digital dictation system in accordance with the invention has the advantage that the information stored on an exchangeable chip card can be played back only on such playback devices which are previously designated by the system operator using a freely selectable code.

In an embodiment the code number is generated in a stationary dictation device by means of a hidden code switch or by means of an input keyboard and is transferred to a storage card, whereby the entire content of the storage card is previously erased and with the assistance of the storage card encoded in this fashion, mobile dictation devices can be code-programmed by means by simultaneous operation of two or more available keys, whereby the code transfer is confirmed acoustically or optically but the code number is not displayed. In this advantageous device configuration, the individual encoding of a dictation device working together with a dictation system can take place without having the safety code accessible to a third party.

An embodiment of the digital dictation system is characterized in that for each recording on the mobile or stationary dictation device, the code stored in the device is compared with the code which is possibly present on the storage card and that, in the event of lack of agreement between the two codes, a recording is only possible if the entire memory content of the data memory is previously erased, whereby during recording the code stored inside the device is then automatically transferred to the storage card. This has the advantage that differently encoded chip cards can be utilized with arbitrary recording devices for new dictation recordings without having to disclose the previous contents of the data memory.

An embodiment of the digital dictation system is characterized in that, for the unlimited read-out of stored dictations with arbitrary playback devices, the code security can be rendered inoperative through the input of a universal code into the stationary dictation device provided for code programming of the mobile dictation device. This embodiment has the advantage that the memory contents of the chip cards can be read out in an advantageous fashion with arbitrary playback devices in the event that confidentiality is not required.

A preferred embodiment is characterized in that the comparator circuit which is integrated on the storage card is first fed with current when inserting the storage card into mobile or stationary dictation device. This has the advantage that the chip cards functioning as data storage media require no voltage supply on the card to secure data storage.

The invention is described below in accordance with the drawing.

BRIEF DESCRIPTION OF THE DRAWINGS

The sole FIGURE shows, in principle, a block diagram of the device configuration of the dictation system in accordance with the invention.

DESCRIPTION OF THE PREFERRED EMBODIMENT

The digital dictation system shown in the drawing consists essentially of one or more mobile hand dictation devices 1, a storage card 2 which can be in contact therewith which is in the form of a chip card, and one or more stationary office dictation devices 3 which are adapted for contact with the above-mentioned chip card.

The mobile and stationary dictation devices are initially distinguished from each other only by their detailed construction, by the manner in which the power is supplied and by the operating functions adapted to specific applications. Both device embodiments contain an analog signal amplifier 1.1 or 3.1 for amplifying the voice signals coming from a microphone, an analog/digital converter 1.2 or 3.2 for converting the speech signals into digital data, and a microcomputer 1.4 or 3.4 for the compression and addressing of the digital voice data as well as for controlling various device functions. These functions can also be carried out by a separate digital signal processor and an additional control circuit.

The digital speech data generated by the respective dictation devices utilized for recording are written via a comparator circuit 2.2 onto the storage card 2 in the corresponding data memory 2.1. This memory can, for example, essentially consist of a non-volatile flash-EEPROM memory, whereby this type of storage medium is suitable for the code security to be described below, since overwriting of the memory is not possible without first erasing the memory or the memory region. However, all other types of non-volatile memory can be utilized. Important is that the data input and the subsequent access to these data for replay takes place only via the comparator circuit 2.2, whereby both the data input as well as the data sampling is blocked by the comparator circuit 2.2 in the event that, as described later, the safety code deposited in a storage region of the data memory 2.1 does not agree with the code delivered by the correspondingly contacted dictation device.

For the replay of the information stored on the storage card 2, which can take place via a mobile hand dictation device 1 as well as via a stationary office dictation device 3, the speech data are decompressed in microcomputer 1.4 or 3.4, converted in the digital/analog converter 1.6 or 3.6 into an analog speech signal, and introduced to a loudspeaker via analog final amplifier 1.7 or 3.7.

As far as the signal preparation for recording and playback of information is concerned, there is no difference, in principle, between the mobile and stationary dictation devices.

However, in accordance with the invention, the mobile and stationary dictation devices are configured in such a fashion that they, in conjunction with the chip card serving as data storage medium, prevent an unauthorized listening-in of information stored on the chip card by means of an individually selectable code.

This code is initially introduced to the stationary office device 3 utilized in the dictation system by means of a hidden code selection switch and secured mechanically or is written into the code memory 3.5 via a code input keyboard 3.3 which can also serve a double function as a general operating keyboard. In the event that a storage card 2 is inserted in the stationary device 3, the data memory 2.1 is initially completely erased and the code is automatically copied out of the code memory 3.5 into a memory region of the storage memory 2.1. It is, however, also possible to introduce copying of the code by initialization of the recording function. In this case, the stationary dictation device 3 sends the code contained in its code memory 3.5 to the comparator circuit 2.2 which checks for correspondence to a code which has possibly already been recorded on the storage card 2. In the event that no correspondence can be determined, the stationary dictation device requests, by means of an optical or acoustical signal, the user to erase, by means of appropriate command input into the dictation device 3, the data memory 2.1. In the event that the dictation device 3 is again subsequently placed into a record-ready state, the code is automatically copied out of the code memory 3.5 into a partial region of the data memory 2.1.

The storage card 2 encoded in this manner can then be utilized to provide an arbitrary plurality of mobile hand dictation devices with the same code. Towards this end the storage card is inserted into the corresponding hand dictation device and two or more keys present on an operator keyboard are simultaneously operated or operated in a particular time sequence. The mobile device 1 initially checks, via comparator circuit 2.2, whether a code which is possibly already present in the code memory 1.5 of the hand device coincides with the code fixed in the data memory 2.1 of the storage card 2. In the event of no agreement and if the comparator circuit 2.2 recognizes that the portion of the data memory 2.1 which is intended to be used for signal storage is at least partially occupied, the mobile dictation device 1 requests the user, via an optical or acoustical signal, to erase the data memory 2.1 of the storage card 2 by means of appropriate command input. Thereby, however, the memory region of the data memory 2.1 in which the security code is deposited is not erased. Subsequently, the code contained in the data memory 2.1 is automatically transferred to the code memory 1.5 of the mobile dictation device and the programming routine introduced by the initial combination of key operations is terminated with an acoustical signal for confirmation of successful encoding of the mobile hand dictation device 1. An alphanumeric display of the entered code number does not occur in order to prevent manipulation attempts from other devices.

The request for erasure of the signal storage region of the data memory 2.1 does not take place when, during the programming routine, the comparator circuit 2.2 determines that either the signal storage region of the data memory 2.1 is not occupied or that the code which is to be transferred out of the data memory 2.1 is already present in the code memory 1.5 of the mobile hand dictation device 1.

In the event that mobile and stationary devices of a particular dictating device configuration are programmed with the same code, arbitrary storage cards can be utilized for the recording of dictation. As soon as the corresponding recording device is placed into the recording-ready mode, the comparator circuit 2.2 checks whether or not the storage card 2 code coincides with the code of the recording device and, in the event of lack of agreement, initially requests the device user, via an optical or acoustical signal, to erase the entire memory contents of the data memory 2.1. In the subsequent recording procedure the code present in the code memory 1.5 or 3.5 is automatically copied into the data memory 2.1 of the storage card 2.

If, within a particular dictation device configuration, it is to be guaranteed that the information stored on the storage card can also be read out by arbitrarily encoded external playback devices, it is possible for the devices used in the configuration for recording the dictation to be programmed with a universal code which essentially disables the code security. The individual dictation devices are, for example, delivered to customers from the factory in this state, so that dictations which are recorded on new devices can be played back on arbitrarily encoded playback devices already available to the customer without having to previously individually code these devices.

The comparator circuit 2.2 present on the storage card 2 which can, for example, essentially consist of a microprocessor, serves both for code comparison as well as for data transfer between the dictation device 1 or 3 and the storage card 2. It prevents, above all, direct access to the code deposited in the data memory 2.1 and to the information data stored therein. Since, however, it first needs to be activated for the exchange of data, its voltage supply is first effected by contact with the correspondingly utilized recording or playback device. Since a non-volatile memory is utilized as data memory 2.1, the storage card 2, advantageously, does not require support batteries so that its functionability is guaranteed without time limit.

We claim:

1. A digital dictation system comprising:

a stationary dictation device having one of a hidden coda switch and an input keyboard for generating a card code and having a stationary memory for storing said card code, said stationary dictation device having a stationary analog to digital converter means for converting analog speech signals into digital data and a stationary digital to analog converter means for converting digital data into analog speech signals, said stationary dictation device having means for transferring said card code out of said stationary dictation device;

a mobile dictation device having two keys to enable transfer of said card code into said mobile dictation device and a mobile memory for storing said card code, said mobile dictation device also having a mobile analog to digital converter means for converting analog speech signals into digital data and a mobile digital to analog converter means for converting digital data into analog speech signals; and a storage card having a card memory for storing card data and for storing said card code, said storage card having a comparator circuit connected to said card memory to restrict read-out of said card memory via said comparator circuit only, said comparator circuit for connection to said transfer means to transfer said card code from said stationary memory via said comparator circuit to said card memory, said comparator circuit also for transferring said card code from said card memory to said mobile memory and for erasing said card data prior to transfer of said card code from said stationary memory to said card memory and for erasing said card data prior to transfer of said card code from said card memory to said mobile memory.

2. The system of claim 2, further comprising means for inputting a universal code into the stationary dictation device for allowing unlimited read-out of the storage card with arbitrary playback devices.

3. The system of claim 1, wherein said stationary memory or said mobile memory store a dictation device code, said comparator circuit comparing said dictation device code with said card code, and in the event of lack of agreement, a recording is only possible if said comparator circuit initiates a prior complete erasure of said card data, and further comprising means for transferring said dictation device code automatically to said storage card after erasure of said card data.

4. The system of claim 1, further comprising means for supplying electrical power to said storage card, the supplying means feeding power to said comparator circuit when inserting said storage card into said mobile or stationary dictation device.

* * * * *